(12) United States Patent
Oemrawsingh et al.

(10) Patent No.: US 10,712,667 B2
(45) Date of Patent: Jul. 14, 2020

(54) OPTICAL DEVICE AND ASSOCIATED SYSTEM

(71) Applicant: ASML Netherlands B. V., Veldhoven (NL)

(72) Inventors: Sumant Sukdew Ramanujan Oemrawsingh, Veldhoven (NL); Arno Jan Bleeker, Westerhoven (NL); Alexander Matthijs Struycken, Eindhoven (NL); Engelbertus Antonius Fransiscus Van Der Pasch, Oirschot (NL); Bert Pieter Van Drieënhuizen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/462,742

(22) PCT Filed: Nov. 16, 2017

(86) PCT No.: PCT/EP2017/079481
§ 371 (c)(1),
(2) Date: May 21, 2019

(87) PCT Pub. No.: WO2018/108440
PCT Pub. Date: Jun. 21, 2018

(65) Prior Publication Data
US 2019/0377267 A1    Dec. 12, 2019

(30) Foreign Application Priority Data
Dec. 14, 2016  (EP) .................................... 16203954

(51) Int. Cl.
*G03F 7/20* (2006.01)
*G02B 5/32* (2006.01)
(Continued)

(52) U.S. Cl.
CPC .......... *G03F 7/70141* (2013.01); *G02B 5/32* (2013.01); *G02B 27/4222* (2013.01);
(Continued)

(58) Field of Classification Search
CPC ....................................................... G02B 5/32
See application file for complete search history.

(56) References Cited

U.S. PATENT DOCUMENTS

| 6,104,489 A | 8/2000 | Larsson et al. |
| 2004/0022291 A1 | 2/2004 | Das et al. |

(Continued)

FOREIGN PATENT DOCUMENTS

| CN | 104155771 A | 11/2014 |
| CN | 104536149 A | 4/2015 |

(Continued)

OTHER PUBLICATIONS

International Search Report and Written Opinion of the International Searching Authority directed to related International Patent Application No. PCT/EP2017/079481, dated Feb. 1, 2018; 10 pages.

(Continued)

*Primary Examiner* — Michelle M Iacoletti
(74) *Attorney, Agent, or Firm* — Sterne, Kessler, Goldstein & Fox P.L.L.C.

(57) ABSTRACT

An alignment system aligns a laser beam to a desired position in a reference plane and to a desired direction in the reference plane. The system diffracts the laser light into different diffraction orders that are projected onto a detection plane using different lenses. As the locations of the projections of the different diffraction orders in the detection plane respond differently to changes in position and in direction of the beam in the reference plane, the locations of the projections enable to determine how to adjust the beam so as to get (Continued)

the beam properly aligned. The diffraction and the projection can be implemented by a hologram.

10 Claims, 7 Drawing Sheets

(51) Int. Cl.
  *G03F 9/00* (2006.01)
  *G02B 27/42* (2006.01)
(52) U.S. Cl.
  CPC .......... *G03F 7/7015* (2013.01); *G03F 7/7055* (2013.01); *G03F 7/70058* (2013.01); *G03F 7/7085* (2013.01); *G03F 7/70158* (2013.01); *G03F 9/7003* (2013.01); *G03F 7/70033* (2013.01)

(56) References Cited

U.S. PATENT DOCUMENTS

| | | |
|---|---|---|
| 2004/0114122 A1 | 6/2004 | Teeuwen |
| 2015/0168848 A1 | 6/2015 | Tanaka et al. |

FOREIGN PATENT DOCUMENTS

| | | |
|---|---|---|
| DE | 102006018804 A1 | 11/2006 |
| WO | WO 2011023765 A1 | 3/2011 |

OTHER PUBLICATIONS

International Preliminary Report on Patentability directed to related International Patent Application No. PCT/EP2017/079481, dated Jun. 18, 2019; 8 pages.

OPTICAL DEVICE AND ASSOCIATED SYSTEM

CROSS-REFERENCE TO RELATED APPLICATIONS

This application claims priority of EP application 16203954.9 which was filed on 14 Dec. 2016 and which is incorporated herein in its entirety by reference.

FIELD

The present invention to an optical device for projecting at least two images of a beam of light in a plane, to an alignment system and an associated method.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses extreme ultraviolet (EUV) radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic system may comprise one or more radiation sources for producing electromagnetic radiation of the proper wavelength to be used for imaging the pattern on the mask onto a substrate covered with a photosensitive layer. Such a radiation source may involve the use of a high-power laser system to eventually produce the electromagnetic radiation used for the imaging. For example, in order to produce electromagnetic radiation in the EUV range, a high-power CO2-laser may be used to turn a droplet of tin into plasma by stripping the electrons away from the tin atoms, that are left behind as ions. The plasma emits the electromagnetic radiation in the EUV range when the ions and electrons recombine.

In order to get the laser beam from the laser to a point of interest, the lithographic system includes a beam delivery system comprising optical components such as a beam-splitter, a lens or a mirror. It is important that the laser beam is accurately aligned, especially if the laser beam is of high-intensity, in order to prevent damage to the beam delivery system or to hardware beyond and in roder to make efficient use of the laser beam at the pointy of interest, such as the tin droplet. To control alignment of the laser beam, or generally of a beam of electromagnetic radiation, also colloquially referred to herein as a beam of light, one or more of the optical components in the beam delivery system may be manipulated. The manipulation of the beam of light may include alignment of linear components and/or angular components of beam pointing (or beam pointing stability or accuracy) of the beam of light. The linear component of beam pointing may originate from displacement of the beam of light in a direction perpendicular (or substantially perpendicular) to an axis of propagation of the beam of light. The term "linear component" may be indicative of a position of the beam in a reference plane intersected by the beam. The angular component of beam pointing may originate from a tip or tilt of the beam of light relative to some reference axis, i.e., the angular component of the beam may originate from the electromagnetic radiation having a propagation direction different from the direction of the reference axis. The term "angular component" may encompass or be referred to as beam pointing and is indicative of the direction of propagation of the beam of light relative to a reference direction of the reference axis.

Methods for determining the alignment of the beam of light may involve the use of an alignment system that comprises, e.g., one or more beam splitters, mirrors and/or lenses in order to create an image of the beam on a detector such as a camera. The image captured by the camera can then be rendered on a display monitor for inspection by a human operator. However, the use of such an alignment system may require additional space wherein the alignment system is to be installed for operational use. This may make these methods becoming unsuitable for use in a lithographic system, where space may be restricted.

Using such alignment system may lead to information on only one of the linear component and the angular component of the beam as detected by the detector. A user may need to shift or re-orient the beam splitters, mirrors and/or lenses in a path of the beam of light to receive information on either of the linear component or the angular component of the beam of light. This may lead to an increase in the time necessary for alignment of the beam of light in the lithographic system.

It is an object of the present invention to obviate or mitigate at least one problem of prior art techniques.

SUMMARY

The invention relates to a radiation source system comprising an alignment system. The alignment system is configured for determining a position of a beam of electromagnetic radiation relative to a reference position in a reference plane, and for determining a direction of the beam relative to a reference direction in the reference plane. The alignment system is configured for projecting onto a detection plane an image representative of the beam intersecting the reference plane. The alignment system includes a diffractive optical system. The diffracting optical system is operative to diffract the incident electromagnetic radiation into different diffraction orders. The diffracting optical system has a first lens and a second lens. The first lens is operative to create a first projection of a first specific one of the different diffraction orders onto a first location in the detection plane. The second lens is operative to create a second projection of a second specific one of the different diffraction orders onto a second location in the detection plane, the second location being different from the first location.

The locations of the projections of the diffraction orders on the detection plane respond differently to changes in the position and/or direction of the beam in the reference plane. Accordingly, by analyzing the locations of the projections in the detection plane, information can be obtained about whether or not the beam has the desired position and desired direction in the reference plane. From the locations of the projections in the detection plane it can be inferred what optical device (e.g., a lens, a mirror or a beam-splitter) in the radiation source system needs to be adjusted to bring the beam towards the desired position and desired direction in the reference plane.

Consider, for example, the zero-th diffraction order and a first diffraction order. The locations of the images of these different diffraction orders in the detection plane respond differently to a displacement of the beam in a direction perpendicular to the direction of propagation of the electromagnetic radiation (i.e., a change in the linear component) and respond differently to a change in direction of propagation of the electromagnetic radiation (i.e., a change in the angular component). In short, the locations of the images or of the projections of the different diffraction orders in the detection plane together contain information on the linear component as well as on the angular component of the beam where it intersects a reference plane that is determined by the focal lengths of the lenses used.

Accordingly, by means of determining the actual locations of the images relative to reference marks in the detection plane, an operator may be able to adjust one or more mirrors, lenses or beam-splitters upstream of the diffractive optical element so as to get the images at the desired locations. Alternatively, a data processing system may perform an analysis of the relative locations of the images in the detection plane and instruct actuators, associated with the relevant ones of the lenses, mirrors or beam-splitters, to adjust their position and/or orientation in order to get the images at their desired locations in the detection plane and, therefore, to get the beam properly aligned.

The term "beam of light" may be considered as encompassing a portion of the beam of light that may be incident on the diffractive optical system or all of the beam of light incident on the diffractive optical system.

Preferably, the first projection and the second projection are substantially non-overlapping in the detection plane. As the locations of the projections in the detection plane contain information about the beam alignment, the locations should be able to be determined accurately. If a specific projection is a two-dimensional image resulting from a two-dimensional intensity distribution (such as from a zero-th diffraction order), one may need to determine, e.g., the center of the two-dimensional image. If images were to overlap, it would be more difficult to determine the centers as it might be unclear which part belongs to what image. Accordingly, the focal lengths of the lenses of the diffractive optical system are preferably selected so as to create in the detection plane non-overlapping images of the different orders so as to facilitate assigning a specific location in the detection plane to a specific one of the images. For example, if the zero-th diffraction order is being used for aligning the beam, one may choose to use a lens for imaging onto the detection plane the cross-section of the beam in the reference plane upstream of the diffractive optical element. If a first diffraction order is being used, one may use a lens that focuses the radiation of the first diffraction order onto a small area (a "point") in the detection plane In an embodiment, the first specific one of the different diffraction orders is a zero-th diffraction order. The first lens is operative to project onto the detection plane a first image of an intensity distribution of the beam in a cross-section with the reference plane. The first lens may have a focal distance equal to the distance between the reference plane and the first lens. Accordingly, the first lens forms a two-dimensional image of the cross-section of the beam intersecting the reference plane. The second specific one of the different diffraction orders is a first diffraction order. The second lens has a focal length substantially equal to a distance between the second lens and the detection plane. The first diffraction order will get projected into the focus of the second lens, the focus residing in the detection plane. Theoretically, the projection of the first diffraction order will form a point in the detection plane.

In a further embodiment, the diffractive optical system has a third lens. The third lens is operative to create a third projection of a third specific one of the different diffraction orders onto a third location in the detection plane different from the first location and different from the second location. For example, the second specific one of the different diffraction orders is a first diffraction order (+1) and the third specific one of the different diffraction orders is another first diffraction order (−1) in a grating having one-dimensional periodicity. With an additional diffraction order, it is possible to determine if an anomaly in the beam alignment as detected is caused by a change in relative orientation of the detection plane and the diffractive optical system or if the anomaly is caused by beam not having the desired location and direction in the reference plane. A shift in beam pointing in the reference plane will move the projections of the first diffraction orders all in the same direction, whereas a change in relative orientation of the detection plane and the diffractive optical system will have the projections move in opposite directions. Furthermore, as the second lens and third lens operating on the different diffraction orders (+1 and −1) are used in off-axis imaging, the projections of the different diffraction orders on the detection plane may suffer from aberrations. If there are multiple diffraction orders, such as the "+1" diffraction order and the "−1" diffraction order, the aberrations occur on different sides of the projections on the detection plane. Accordingly, the effect of the aberrations on determining the locations of the projections may be reduced by processing the data representative of the projections so as to combine the projections to cancel out the aberrations. In a further embodiment, the diffractive optical system has a third lens, a fourth lens and a fifth lens. The third lens is operative to create a third projection of a third specific one of the different diffraction orders onto a third location in the detection plane different from the first location and different from the second location. The fourth lens is operative to create a fourth projection of a fourth specific one of the different diffraction orders onto a fourth location in the detection plane different from the first location, different from the second location and different from the third location. The fifth lens is operative to create a fifth projection of a fifth specific one of the different diffraction orders onto a fifth location in the detection plane different from the first location, different from the second location, different from the third location and different from the fourth location. For example, the diffractive optical system includes a two-dimensional grating operative to produce four different first diffraction orders (0,1), (1,0), (−1,0) and (0,−1). The second specific one of the different diffraction orders is a first one of the four different first diffraction orders. The third specific one of the different diffraction orders is a second one of the four different first diffraction orders. The fourth specific one of the different diffraction orders is a third one of the four different first diffraction orders and the fifth specific one of the different diffraction orders is a fourth one of the four different first diffraction orders. Each respective one of the second lens, the third lens, the fourth lens and the fifth lens has a respective focal length substantially equal to a distance between the respective lens and the detection plane.

In a further embodiment, the diffractive optical system includes a hologram. The hologram is configured to serve as a grating and as the lenses mentioned above. The lenses may be configured as Fresnel lenses. This embodiment may be advantageous where space, available in the radiation source for installing alignment hardware, is restricted.

In a further embodiment, the alignment system comprises a detection system configured for detecting the first projection and the second projection in the detection plane. The detection system comprises, for example, a camera or another image sensor, whose output signal can be rendered on a display monitor so that a human operator has visual feedback during alignment of the beam. For example, the radiation source may include a beam delivery system to guide the beam of electromagnetic radiation to a region of interest, the beam delivery system including a mirror, a lens or a beam-splitter. By inspecting the image rendered on the display monitor, the human operator may be able to adjust one or more relevant ones of the mirrors, lenses or beam-splitters so as to properly align the beam of electromagnetic radiation In a further embodiment, the alignment system comprises an optical device such as a lens, a mirror or a beam-splitter, configured for controlling at least one of: the position of the beam relative to the reference position and the direction of the beam relative to the reference direction. The alignment system further has an actuator configured for adjusting at least one of a further position and an orientation of the optical device. The alignment system also includes a controller configured for receiving an output signal from the detection system and for controlling the actuator in dependence on the output signal received. Thus, alignment can be automated.

The invention also relates to an alignment system configured for use in the radiation source system detailed supra, and to a hologram configured for use in such radiation source system.

The computer program product may be provided on a carrier medium. The carrier medium may be a tangible, non-transient carrier medium, such as a flash drive, memory stick, optical disk or carrier, magnetic disk or carrier, memory, ROM, RAM, and/or the like. The carrier medium may be, comprise or be comprised in, a non-tangible carrier medium such as an electromagnetic wave, electronic or magnetic signal, digital data and/or the like.

It should be understood that the features defined above in accordance with any aspect of the present invention or below in relation to any specific embodiment of the invention may be utilised, either alone or in combination with any other defined feature, in any other aspect or embodiment of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
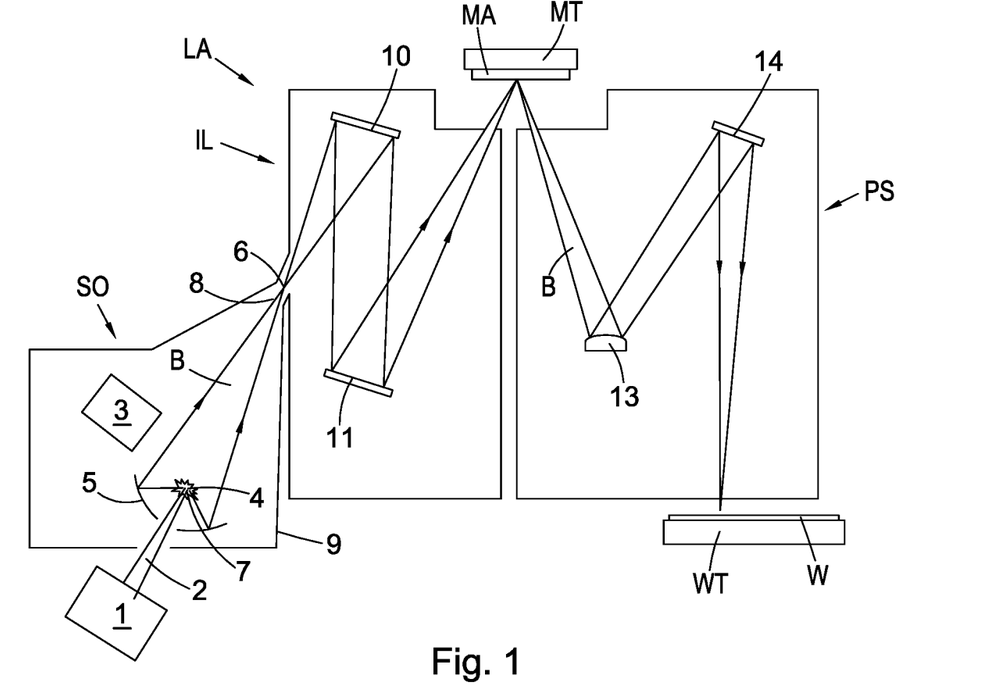
FIG. 1 depicts a lithographic system comprising a lithographic apparatus.

FIG. 1 shows a lithographic system comprising a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to as a normal incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two focal points. A first focal point may be at the plasma formation region 4, and a second focal point may be at an intermediate focus 6, as discussed below.

The laser 1 may be remote from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

In the embodiment of FIG. 1, a supply of hydrogen is also provided through the opening 1 generally along the same axis as the laser beam. Hydrogen may also be supplied around the perimeter of the collector 5, and/or optionally through supply ports. The hydrogen serves a number of purposes including maximising suppression of contamination of the collector 5 (and also optionally contamination of metrology modules, (not shown)), acting as a source of hydrogen radicals for decontamination, and conditioning the plasma to keep hot ionized gas away from the collector CO and from the metrology modules.

Returning to consideration of the radiation produced by the source SO, radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired intensity distribution in the cross-section of the radiation beam B. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the, now patterned, radiation beam B enters the projection system PS. The projection system comprises a plurality of mirrors which are configured to project the patterned radiation beam B onto a substrate W held by the substrate table WT. The projection system PS may apply a reduction factor to the patterned radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

The radiation source SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figure 2:
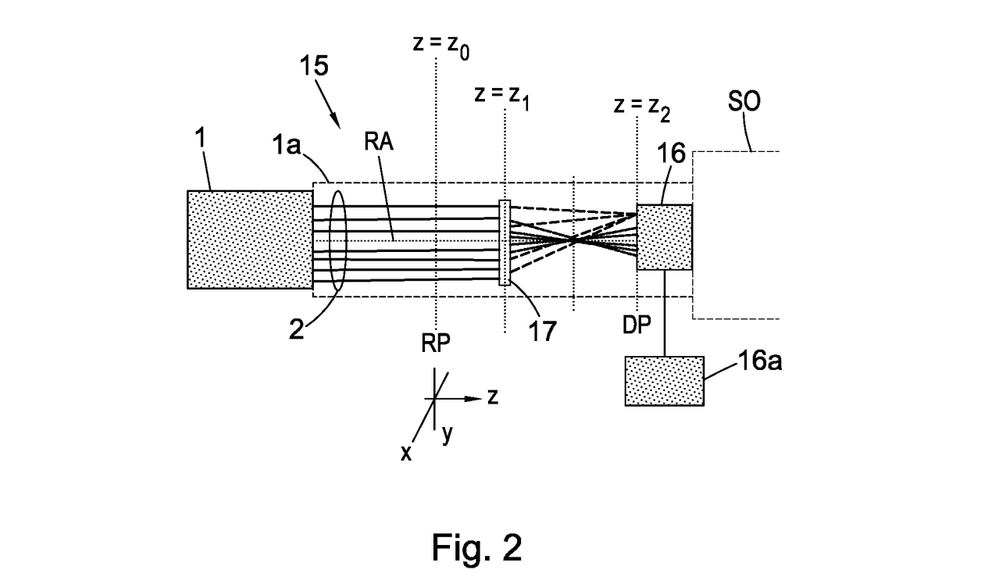
FIG. 2 depicts an alignment system including a diffractive optical system according to an embodiment for use in the lithographic system of FIG. 1.

FIG. 2 illustrates an embodiment of an alignment system 15. The alignment system 15 may be part of the lithographic system shown in FIG. 1. In the embodiment of FIG. 2 the alignment system 15 includes a beam delivery system 1a. The beam delivery system 1a may be configured to pass the laser beam 2 from the laser 1 to the radiation source SO. The alignment system 15 may be part of, or be arrangeable in, the beam delivery system 1a. The beam delivery system 1a may comprise one or more optical devices, such as a mirror, a lens or a beam-splitter, that are configured for properly aligning the beam 2.

The alignment system 15 includes a detection system 16, which may include an optical detector, such as a camera, CCD array or CMOS image sensor or the like. It will be appreciated that the detection system 16 may provide an output signal to a display monitor in order to render the output signal for visual inspection by an operator. The alignment system 15 includes an diffractive optical system 17 for projecting at least two images of a beam of light, which in this embodiment is provided in the form of the laser beam 2, in a plane. In this embodiment the plane may be in the form of a detection plane DP defined by the detection system 16. The detection element 16 may be connected to a controller 16a, which may include a display monitor for displaying the two images to a user.

The diffractive optical system 17 comprises a diffraction grating (not shown) and two or more lenses (not shown here). The diffraction grating is operative to diffract the electromagnetic radiation of the beam 2 into a plurality of different diffraction orders. As different diffraction orders propagate in different directions relative to the grating, different ones of the two or more lenses can be used to project different ones of the diffraction orders on different locations of the detection plane DP.

As the higher diffraction orders get diffracted at larger angles than the lower diffraction orders, one may consider, for example, the zero-th diffraction order and one or more of the first-order diffraction orders to be imaged onto the detection element 17. As known, a zero-th diffraction order is typically associated with the direction of the un-interrupted electromagnetic radiation incident on a grating, whereas a non-zero diffraction order is associated with a direction deviating substantially from the direction of the zero-th diffraction order.

With reference to FIG. 2, assume that one wants to determine the linear component as well as the angular component that the beam 2 has at the intersection of the beam 2 with a reference plane RP, the reference plane RP being located at $z=z_0$, and that the detection system 16 has a detection plane DP located at $z=z_2$. Further, assume that one uses the zero-th diffraction order and one of the first diffraction orders.

In order to image the zero-th diffraction order, occurring in the reference plane RP on the detection plane DP, the diffractive optical system 17 uses a lens with a predetermined focal distance. In the example illustrated, the focal distance of the lens for imaging the zero-th diffraction order is chosen as being equal to the distance between the reference plane RP and the diffractive optical system 17, which is optically located in a plane $z=z_1$. Accordingly, the cross-section of the beam 2 at the location of the reference plane RP is imaged in focus onto the detection plane DP. The first diffraction order in this example is imaged by the diffractive optical system 17 using another lens with a predetermined focal distance that in this example is equal to the distance between the diffractive optical element 17 and the detection plane DP. Accordingly, the first diffraction order is imaged in the focus of this other lens.

It is remarked here that lenses with other, known, focal distances can be used than the ones above. It is preferred, however, to image the selected diffraction orders on the detection plane DP in such a way, that their respective images or projections in the detection plane DP do not overlap. The reason for this is that the respective locations of the respective centers of these respective images in the detection plane DP are indicative of the linear component and the angular component, as will be explained below. If two or more of these images have an overlap in the detection plane DP, it will be more difficult to determine accurately the locations of their respective centers.

Assume that the beam 2 is incident perpendicularly on the diffractive optical system 17, i.e., in the situation of so-called "normal incidence". Shifting the beam 2 in a direction perpendicular to the direction of propagation of the beam's electromagnetic radiation, i.e., perpendicular to the z-direction in the diagram of FIG. 2) causes the image of the zero-th diffraction order to shift accordingly in the detection plane DP. However, the locations of the images of the higher diffraction orders will not shift. Therefore, if one has a reference mark in the detection plane DP that indicates where the center of the image of the beam's zero-th diffraction order should end up in the ideal case, one can determine the distance and relative orientation between the reference mark in the detection plane DP and the actual location of the center in the detection plane DP, and control one or more optical components in the beam delivery system 1a upstream of the reference plane RP so as to bring the center to the reference mark. This can be done by a human operator watching the images on a display monitor connected to the detection system 16. Alternatively, a controller 16a with appropriate image-processing software could be used to automate the bringing back of the center to the reference mark employing one or more actuators operating on one or more optical components in the beam delivery system 1a, upstream of the reference plane RP.

Assume that the beam 2 intersects the reference plane RP under a small, non-zero angle, i.e., in the situation of so-called oblique incidence, wherein the beam 2 has the desired linear component at the reference plane RP. Then, both the image of the zero-th diffraction order and the images of the higher diffraction orders will be shifted from their desired locations in the detection plane DP. The image of the zero-th diffraction order will be shifted in the detection plane DP in a direction indicative of the actual orientation of the beam 2 relative to a reference axis RA and over a distance indicative of the non-zero angle and of the distance between the reference plane RP and the diffractive optical system 17. The higher diffraction orders will likewise be shifted over a larger distance indicative of the non-zero angle and of the distance between the reference plane and the diffractive optical element 17, as well as indicative of the grating pitch. That is, the shifts of the images of the higher diffraction orders are multiplied by a factor indicative of the grating pitch. The expression "grating pitch" has been used here to clarify the concept of the invention. It is clear that a two-dimensional grating can be used with a pitch in the x-direction that is different from a pitch in the y-direction, and that the diffraction pattern for such two-dimensional gratings is expressed using these different pitches as parameters.

It is remarked here that diffraction orders, other than the zero-th diffraction order and a first diffraction order may be selected for being imaged onto the detection plane DP in order to determine the linear component and the angular component of the beam 2, as different diffraction orders respond differently to a change in the position and a change in the direction of the beam 2 in the reference plane RP.

In the embodiment in FIG. 2, the laser beam 2 is directed onto the diffractive optical system 17 by one or more optical component(s) (not shown) of the beam delivery system 1a, such as one or more directing mirror(s), beam expander(s) and/or other optics. It will be appreciated that in other embodiments the laser beam 2 may be (directly) directed or projected onto the diffractive optical system 17, e.g. directly by the laser.

Figure 3:
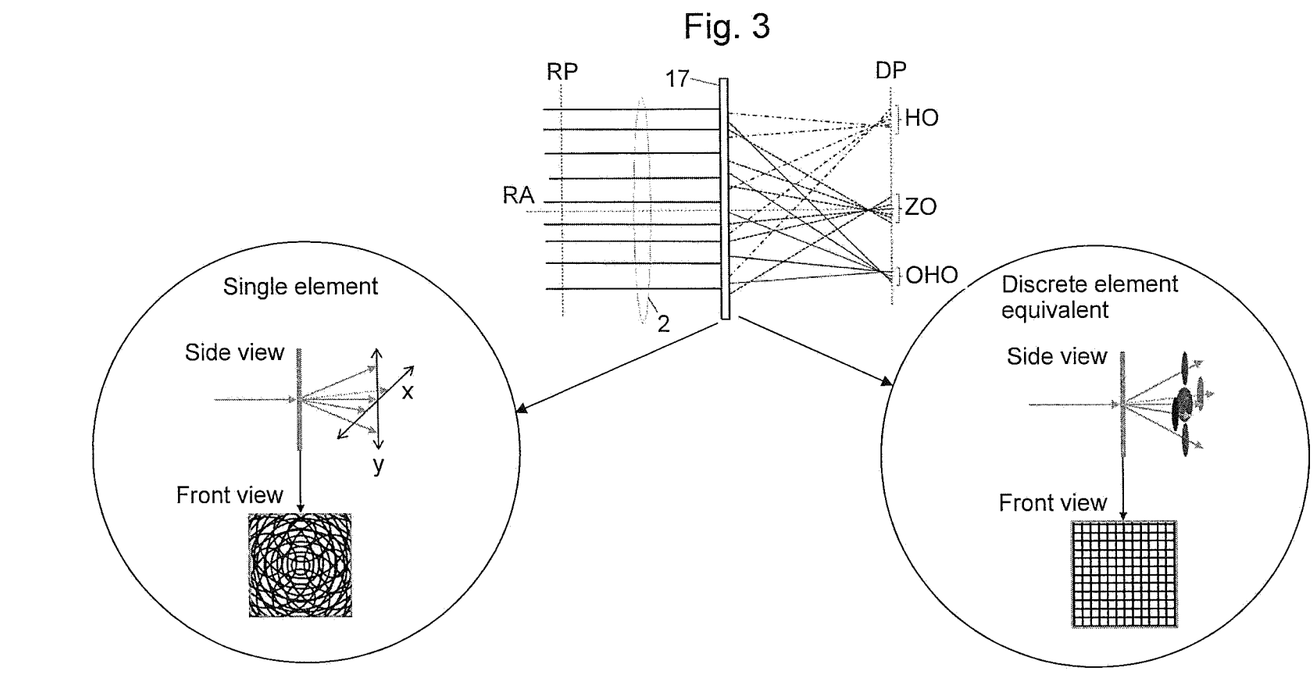
FIG. 3 depicts schematically, a diffractive optical system of the alignment system of FIG. 2 according to a further embodiment.

FIG. 3 illustrates a further embodiment of the optical device 17.

In the further embodiment the diffractive optical system 17 images the zero-th diffraction order on the detection plane DP to create a first image ZO. The diffractive optical system 17 also images a higher diffraction order, e.g., a first diffraction order ("+1" order), to create a second image HO in the detection plane DP. The diffractive optical system 17 further images another higher diffraction order, e.g., another first diffraction order ("−1" order), to create a third image OHO in the detection plane DP. Note that the first image ZO, the second image HO and the third image OHO do not overlap.

By configuring the diffractive optical system 17 to image two or more higher diffraction orders, here a "+1" diffraction order and a "−1" diffraction order, detection of changes in the angular component of the beam pointing may be facilitated. This may be beneficial in cases, where the relative orientation and/or position between the diffractive optical system 17 and the detection system 16 has been changed or adjusted. For example, a change in the angular component of the beam pointing of the laser beam 2, may results in a shift of the locations of the second image HO and the third image OHO in the same direction, while an a change in orientation between the diffractive optical system 17 and the detection system 16 may result in a shift of the locations of the second image HO and the third image OHO in opposite directions.

As can be seen in FIG. 3, the diffractive optical system 17 is configured for creating the second image HO and the third image OHO in the detection plane DP, which are separated from each other and from the first image ZO.

In some embodiments, the diffractive optical system 17 may comprise a holographic optical element, e.g. a hologram. By using a holographic optical element, a single entity may be used to determine information of both the linear component and angular component of the beam pointing (e.g. beam pointing accuracy or stability) of the laser beam 2. This may allow the diffractive optical system 17 to be used, e.g. to be temporally or permanently installed, in a system or apparatus with restricted space.

In some embodiments, the diffractive optical system 17 and the detection system 16 may be arranged in fixed relationship, i.e. a distance between the diffractive optical system 17 and the detection system 16 may be fixed. For example, the optical device 17 and the detection system 16 may be arranged in a diagnostic or auxiliary beam line (not shown) of the lithographic system. The detection system 16 may include first and second reference points. For example, the first and second reference points may correspond to respective first and second reference pixels (or respective first and second areas of pixels) of the detection system 16.

Figure 4:
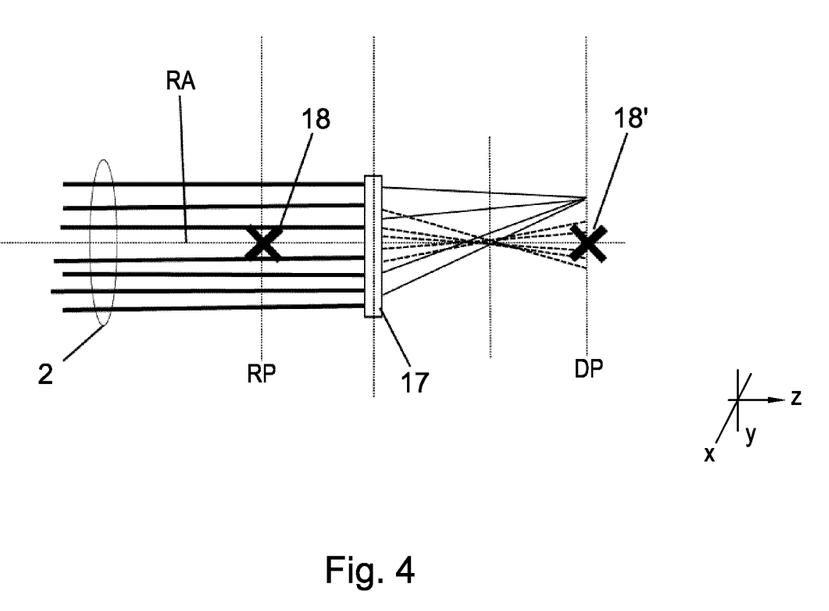
FIG. 4 depicts schematically, the optical device of FIG. 3 and a reference element inserted in a beam path.

In some embodiments, the optical device 17 and the detection system 16 may be provided separately. In such embodiments, a reference element 18, which may be in the form of a cross-hair or aperture or the like, may be inserted into the path of the laser beam 2, as shown in FIG. 4. An image 18' of the reference element 18 is projected in the detection plane DP by the diffractive optical system 17. The image 18' of the reference element 18 may provide the first reference point on the detection plane DP. Based on a position of the first reference point, the arrangement of the lenses (not shown) of the diffractive optical system 17 relative to each other and/or the pre-defined or pre-selected distance D between the optical axes of the lenses, the second reference on the detection plane DP may be determined. Although the diffractive optical system 17 shown in FIG. 4 includes two or more lenses, it will be appreciated that the determination of the second reference point for the diffractive optical system 17 having more than two lenses can be the same or similar to that described above.

It will be appreciated that in other embodiments, the first reference point may be provided by the controller 16a instead of or additionally to the use of the reference element. For example, a computer program, which may be provided or stored in the controller, may be configured to cause the controller 16a to display and/or provide the first reference point. In such embodiments the second reference point may be determined based on a position of the first reference point, the arrangement of the first lens and the second lens relative to each other and/or the pre-defined or pre-selected distance between the/each optical axes of the second lens relative to the optical axis of the first lens. For example, the computer program may be configured to cause the controller 16a to determine the second reference point, e.g. a position thereof, based on a position of the first reference point, the arrangement of the first lens and the second lens relative to each other and/or the pre-defined or pre-selected distance between the/each optical axes of the second lens relative to the optical axis of the first lens.

In use, alignment of the laser beam 2 relative to the detection system 16 may be determined based on positions of the near-field NF and far-field FF images relative to the first and second reference points. When misalignment of the laser beam 2 relative to the detector 16 is detected, the laser beam 2 may be aligned, e.g. by adjusting the position or orientation of the laser 2 and/or position or orientation of one or more optical component(s) of the beam delivery system 1a.

Figure 5A:
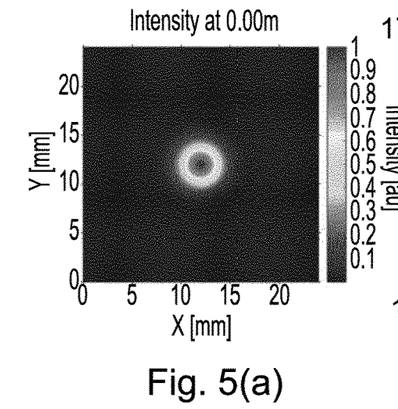
FIG. 5(a) depicts an intensity map of a laser beam in a reference plane.
Figure 5B:
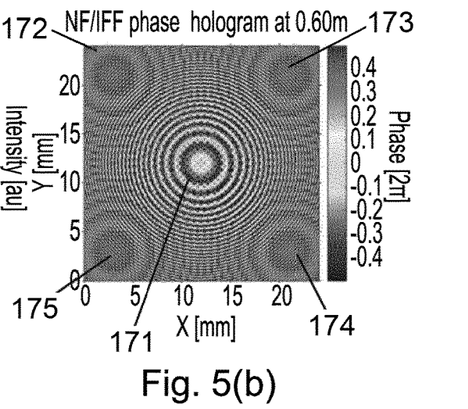
FIG. 5(b) depicts an image of phase information stored in the optical device of FIG. 2.
Figure 5C:
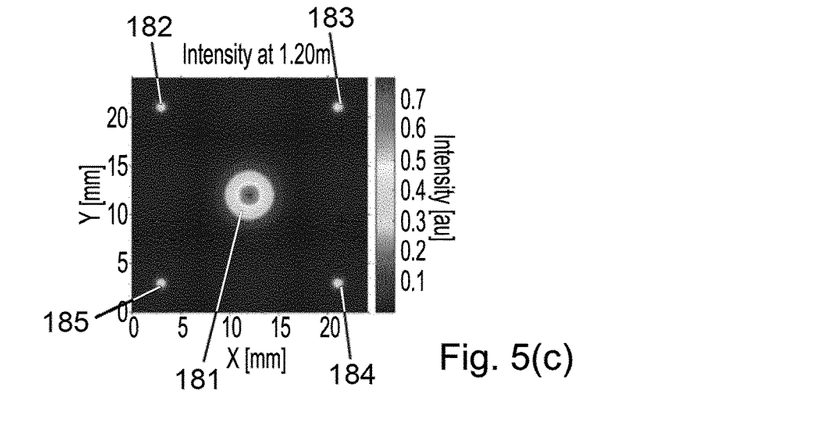
FIG. 5(c) depicts an intensity map of images of the laser beam of FIG. 5(a) in a detection plane.

FIGS. 5(a) and 5(c) show intensity maps of the laser beam 2 in the reference plane RP and the detection plane DP, respectively. FIG. 5(a) shows that, in the reference plane RP, the laser beam 2 has a substantially Gaussian profile. FIG. 5(b) shows an image of the diffractive optical system 17. As described above, the diffractive optical system 17 may include a hologram. FIG. 5(b) shows an image of the phase information stored in the hologram. The hologram performs one or more phase shifts on the light of the laser beam 2, in order to focus the relevant diffraction orders of the laser beam 2. In this embodiment, the hologram is configured to act on the laser beam 2 having a wavelength of 10.6 µm. For example, the laser 1 may be a $CO_2$ laser emitting the laser beam 2 with a wavelength of 10.6 µm. It will be appreciated that in other embodiments, the hologram may be configured to act on a beam of electromagnetic radiation having a different wavelength. The formation of the hologram for a beam of electromagnetic radiation having a different wavelength may depend on the availability of suitable materials for hologram and/or the fabrication accuracy. The approach of embedding multiple lenses via a hologram (or any DOE (diffractive optical element)) is similar to fabricating any DOE. A material that transmits that wavelength (e.g., typically the same material that is being used for making a lens transparent for that wavelength) can be used. For this specific wavelength of 10.6 µm, this material is, for example, ZnSe or diamond.

The embodiment of the diffractive optical system 17 shown in FIG. 5(b) is similar to those shown in FIGS. 2 and 3. In the embodiment of FIG. 5(b), the diffractive optical system 17 includes five lenses 171, 172, 173, 174 and 175.

A first one of the lenses, lens 171, is arranged substantially in the centre of the diffractive optical system 17 and is configured to create in the detection plane DP an image 181 of the zero-th diffraction order of the laser beam 2 at the area in the reference plane RF where the laser beam 2 intersects the reference plane RP. The four other lenses 172, 173, 174 and 175 are positioned evenly around the first lens 171, and are configured to image each of the four first diffraction orders on the detection plane DP, resulting in c the images images 182, 183, 184 and 185, respectively. The four other lenses 172, 173, 174 and 175 are spaced from the first lens 171 by a predetermined distance. For example, the predetermined distance may correspond to multiples of the standard deviation σ, such as 6σ, of the substantially Gaussian intensity profile of the laser beam 2. As described above, by projecting the image 181 of the zero-th diffraction order and the images 182, 183, 184 and 185 of the four first diffraction orders in the same detection plane DP, simultaneous alignment of the linear and angular components of beam pointing of the laser beam 2 may be allowed, without requiring the use of an additional optical device, such as a beam splitter, or a mirror or a lens.

Figure 5D:
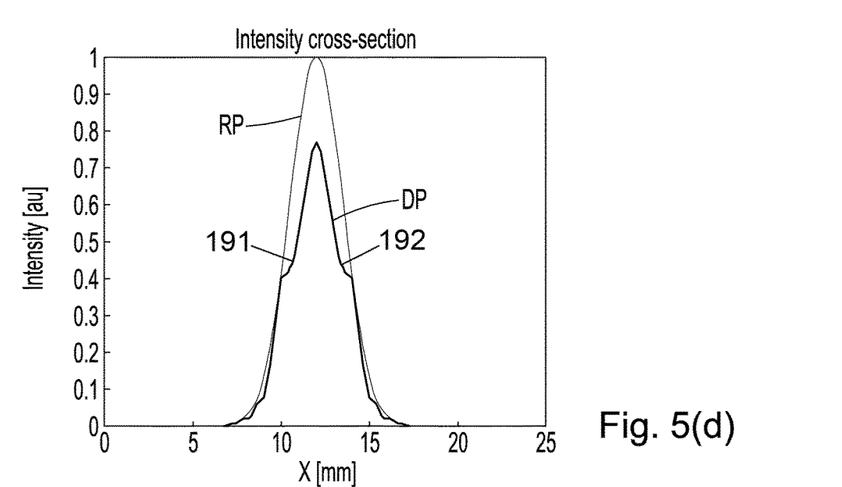
FIG. 5(d) depicts a plot of cross-sections of a profile of the laser beam of FIG. 5(a) in the reference plane and of a profile of an image of the laser beam of FIG. 5(c) in the detection plane.

FIG. 5(d) shows cross-sections of the intensity profile of the laser beam 2 in the reference plane RP and of the intensity of the zero-th diffraction order of image 181 of the laser beam 2 in the detection plane DP. As can be seen in FIG. 5(d), the cross-section of the zero-th diffraction order—image 181 of the laser beam 2 maintains a substantially Gaussian shape. The position of the image 181 of the zero-th diffraction order substantially corresponds with a position of the intersection of the laser beam 2 with the reference plane RP as shown in FIG. 5(a). The shoulders 191 and 192 in the cross-section of the image 181 zero-th diffraction order (or the ringing in the cross-section of the image 181) of the laser beam 2 in the detection plane DP may be due to imaging errors (e.g. interference effects) of the diffractive optical system 17, e.g., of the hologram. These imaging errors may be due to the multiple functions performed by the diffractive optical system 17. The imaging errors of the diffractive optical system 17 may be correctable or compensatable. For example, the imaging errors may be corrected by de-convoluting the image 181 of the zero-th diffraction order and the images 182, 283, 184 and 185 of the first diffraction orders and by compensating for the ringing or interference effects, based on the configuration of the diffractive optical system 17, e.g. the relative spatial arrangement of lenses 171, 172, 173, 174 and 175, before restoring the image 181 of the zero-th diffraction order.

FIGS. 6(a) to 6(d) show intensity maps of the laser beam 2 projected by the diffractive optical system 17 in the detection plane DP. The diffractive optical system 17 includes five lenses, as described above. In this embodiment, the detection plane DP includes a first reference point 601 and four second reference points 602, 603, 604 and 605. The position of the first reference point 601 may be provided by the controller 16a, e.g., using a computer program, which may be configured to cause the controller 16a to provide and/or display the position of the first reference point 601 on a display monitor. The positions of the second reference points 602, 603, 604 and 605 have been derived from the position of the first reference point 601, the arrangement of the lenses 171, 172, 173, 174 and 175 relative to each other and/or the distances between the optical axes of the lenses 171, 172, 173, 174 and 175, as described above.

Figure 6A:
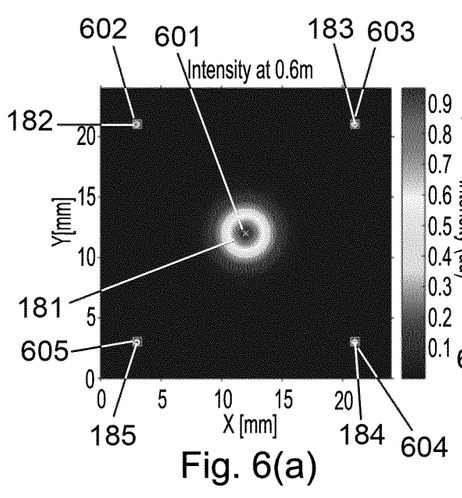
FIGS. 6(a) to 6(d) depict intensity maps of the images of the laser beam of FIG. 5(c) relative to reference points.

In FIG. 6(a), the positions of the image of the zero-th diffraction order 181 and the images 182, 183, 184 and 185 of the of the first diffraction orders correspond to the positions of the reference points 601, 602, 603, 604 and 605, respectively, in the detection plane DP. Accordingly, the laser beam 2 can be considered to be aligned relative to the detection system 16.

Figure 6B:
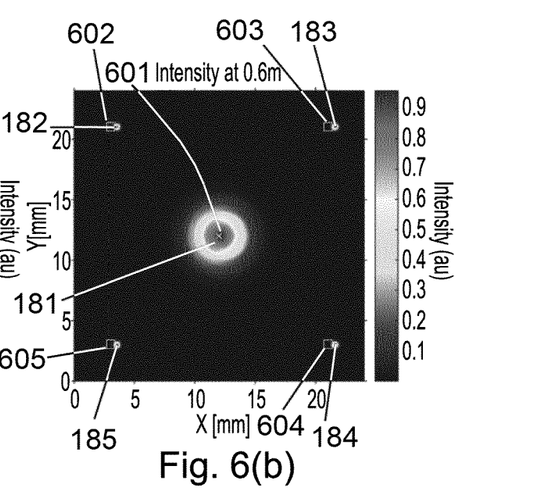

In FIG. 6(b), the positions of the images 182, 183, 184 and 185 of the first diffraction orders are shifted relative to the second reference points 601, 602, 603, 604 and 605, while the position of the image 181 of the zero-th diffraction order corresponds to that of the first reference point 601. The shift of the images 182, 183, 184 and 185 relative to the second reference points 602, 603, 604 and 605 is indicative of a misalignment of the angular component of the beam pointing of the laser beam 2. The shift of the images 182, 183, 184 and 185 relative to the second reference points 602, 603, 604 and 605 corresponds to, e.g., a 2 mrad tilt or tip of the laser beam 2, here to the right, relative to the reference axis or reference direction.

Figure 6C:
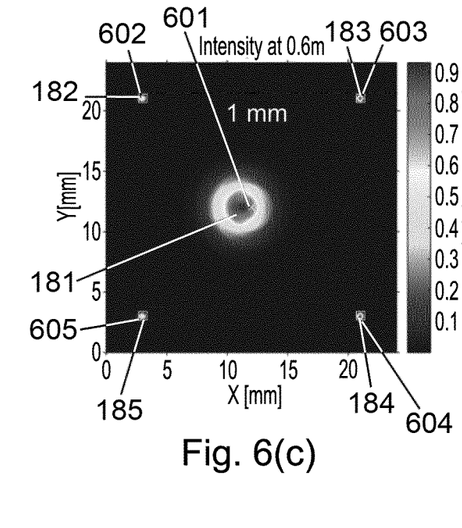

In FIG. 6(c), the position of the image 181 is shifted relative to the first reference point 601, while the positions of the images 182, 183, 184 and 185 correspond to the positions of the second reference points 602, 603, 604 and 605. This shift of the image 181 relative to the first reference point 601 is indicative of a misalignment of the linear component of the beam pointing of the laser beam 2. The shift of the image 181 relative to the first reference point 601 corresponds to displacement of the laser beam 2 in the reference plane RP by, e.g., 1 mm in a direction substantially perpendicular to the reference axis, here to the left.

Figure 6D:
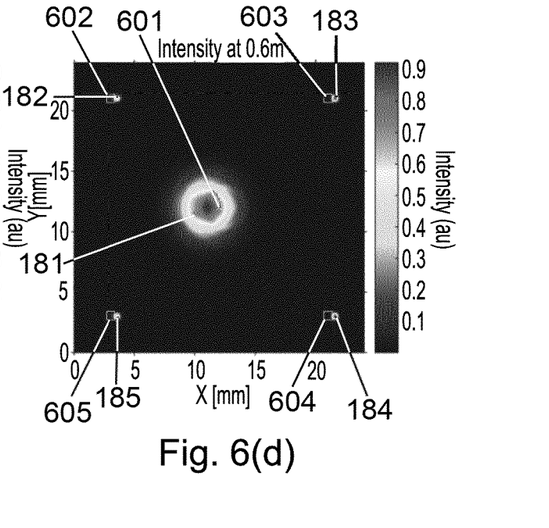

In FIG. 6(d), the positions of the image 181 and of the images 182, 183, 184 and 185 are shifted relative to the first and second reference points 601, 602, 603, 604 and 605. This shift of both the image 181 of the zero-th diffraction order and the images 182, 183, 184 and 185 of the four first diffraction orders relative to the first and second reference points 601, 602, 603, 604 and 605 is indicative of a misalignment of the linear and angular components of the beam pointing of the laser beam 2. The shift of the image 181 relative to the first reference point 601 corresponds to a displacement of the laser beam 2 in the reference plane RP by 1 mm in a direction substantially perpendicular to the axis of propagation of the laser beam 2, while the shift of the images 182, 183, 184 and 185 relative to the second reference points 602, 603, 604 and 605 corresponds to a 2 mrad tilt or tip of the laser beam 2 relative to the reference direction.

FIGS. 7(a) to 7(d) show graphs of the dependencies of the position of the image 181 of the zero-th diffraction order and of the positions of the images 182, 183, 184 and 185 of the first diffraction orders in the detection plane DP on changes in the linear and angular components of the beam pointing of the laser beam 2 in the reference plane RP. The holographic element in the diffractive optical system 17 may cause optical aberration of the laser beam 2, which may result in interference (or crosstalk) between the shifts of the image 181 of the zero-th diffraction order and/or the images 182, 183, 184 and 185 of the first diffraction orders, e.g. in response to changes in the linear and/or angular components of the beam pointing of the laser beam 2 in the reference plane RP. This interference (or crosstalk) can be considered to be small or negligible, as will be described below. In some embodiments, the interference (or crosstalk) may be removable or removed based on the arrangement of the diffractive optical system, e.g. the relative arrangement of the lenses 171, 172, 173, 174 and 175.

Figure 7A:
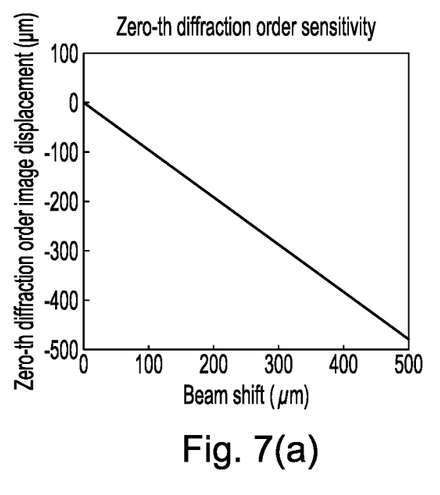
FIGS. 7(a) to 7(d) depict plots of displacements of an image of the laser beam in dependency on changes in alignment of the laser beam.

FIG. 7(a) shows the dependency of the position of the image 181 on changes in the linear component of the beam pointing of the laser beam 2. This figure shows that when the laser beam 2 is shifted in a direction substantially perpendicular to the axis of propagation of the laser beam 2 by a distance x, then the image 181 of the zero-th diffraction order shifts in the detection plane DP by −0.96x (the negative sign is due to the negative magnification of the first lens, as described above).

Figure 7B:
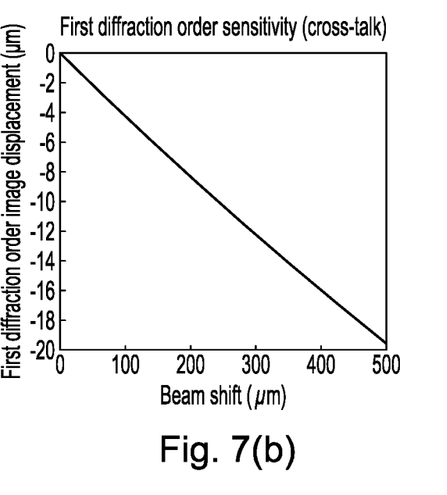

FIG. 7(b) shows the dependency of the position of an image of a first-diffraction order, e.g., image 182 on changes in the linear component of beam pointing of the laser beam 2. This figure shows that when the laser beam 2 is shifted in a direction substantially perpendicular to the axis of propagation of the laser beam 2 by a distance x, then the image 182 shifts in the detection plane DP by 0.039x.

Figure 7C:
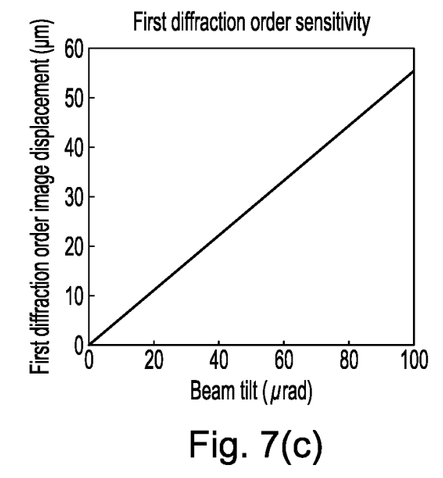

FIG. 7(c) shows the dependency of the position of the image 182 of a first diffraction order on changes in the angular component of the beam pointing of the laser beam 2. This figure shows that when the laser beam 2 is tilted by x relative to the original axis of propagation of the laser beam 2, then the image 182 shifts in the detection plane by 0.93xf (where f corresponds to the focal length of the second lens.

Figure 7D:
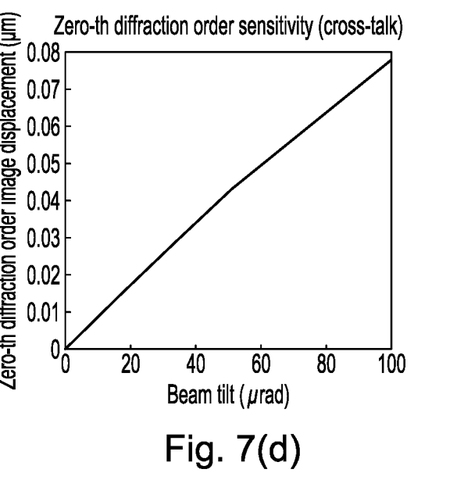

FIG. 7(d) shows the dependency of the position of the image 181 of the zero-th diffraction order on changes in the angular component of the beam pointing of the laser beam 2. This figure shows that when the laser beam 2 is tilted by x relative to the original axis of propagation of the laser beam 2, then the image 181 shifts in the detection plane by 0.001xf.

Figure 8:
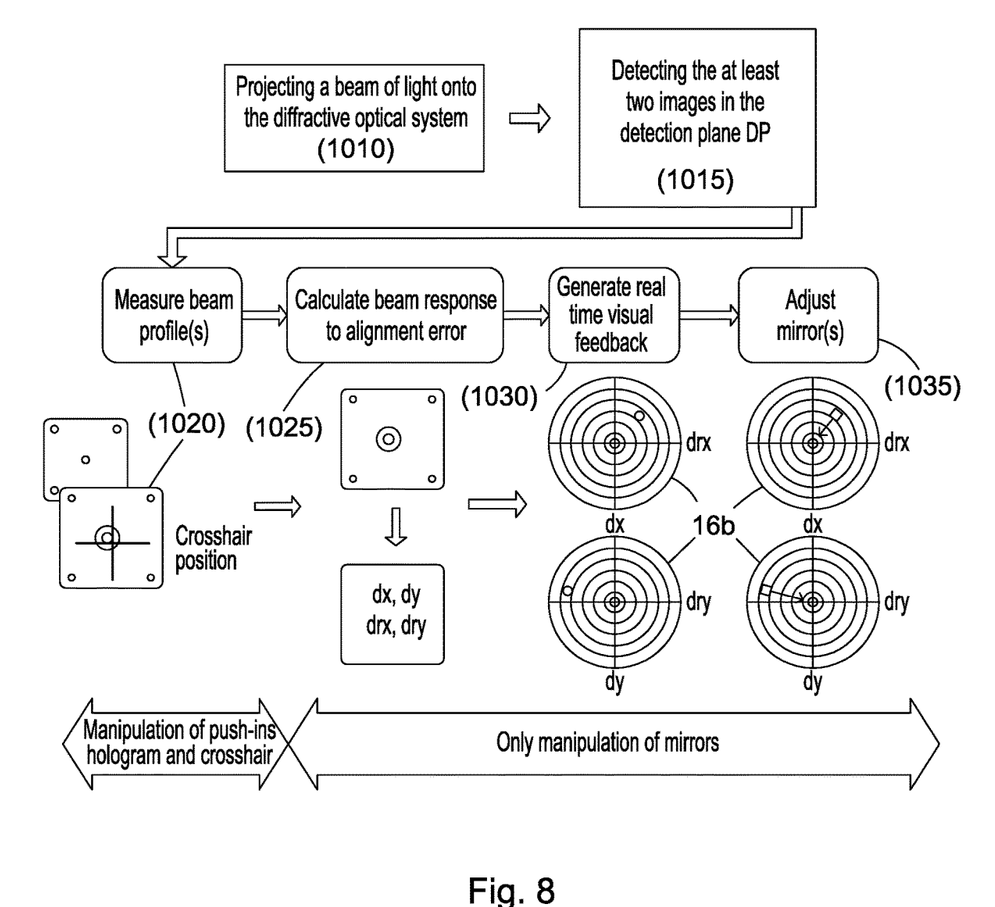
FIG. 8 depicts a flow chart of an alignment method.

FIG. 8 shows a flowchart of a method for aligning the laser beam 2 relative to the detection system 16. The steps of the method shown in FIG. 8 are described with reference to the embodiment shown in FIG. 3. It should be understood that the method is equally applicable to the embodiments shown in FIG. 3(b) and FIGS. 5(b) to 5(d).

As described above, the alignment system 15 may be arranged in the beam delivery system 1a of the lithographic system. As a first step 1010, the method includes projecting the laser beam 2 onto the diffractive optical system 17. For example, the one or more optical devices of the beam delivery system 1a may project the laser beam 2 onto the diffractive optical system 17 At least two images, each of a different diffraction order, are projected on the detection plane DP by the diffractive optical system 17. These images are detected by the detection system 16, which may define the detection plane DP (step 1015). It is assumed, by easy of example, that the first image is the image 181 of the zero-th diffraction order, and that the second image is the image 182 of the first-diffraction order. The step of detecting the two images (1015), can include detecting a position of the first image relative to a first reference point 601 and another position of the second image relative to a second reference point 602 (step 1020). The first reference point 601 and the second reference point 602 may be defined by the detection system 16 and correspond to first and second reference pixels. Alternatively or additionally, a reference element 18, which may be in the form of a cross-hair or aperture, may be inserted into the laser beam 2 and an image 18' of the reference element 18 may be projected in the detection plane DP. The method can include determining one of the first reference point 601 and the second reference point 602 based on the position of the image 18' of the reference element 18 in the detection plane DP. The other one of the first reference point 601 and the second reference point 602 may be determined based on the relative arrangement of the first and second lenses in the diffractive optical device 17 and/or on the position of one of the first reference point 601 and the second reference point 602 in the detection plane DP.

For example, the other one of the first reference point 601 and the second reference point 602 may be determined based on the distance D between the optical axis OA1 of the first lens and the optical axis OA2 of the second optical element lens and/or the position of one of the first and second reference points 601 and 602 in the detection plane DP. The method may comprise determining the alignment of the laser beam 2 relative to the detection system 16, based on the position of at least one of the first and second images 181 and 182 relative to at least one of the first and second reference points 601 and 602.

It will be appreciated that it is not necessary for a physical reference element to be provided. For example, in the embodiment of FIG. 4, the reference element 18 marked with an X does not have to be a physical element and may be taking as representing an image in the detection plane DP.

It will be appreciated that in other embodiments at least one of the first and second reference points 601 and 602 may be provided by the controller 16a, e.g. as part of a computer program, which may be configured to cause the controller 16a to provide at least one of the first and second reference points 601 and 602, and at least other one of the first and second reference points 601 and 602 may be determined based on the relative arrangement of the first and second lenses in the diffractive optical device 17 and/or a position of the at least one of the first and second reference points 601 and 602. For example, the at least other one of the first and second reference points may be determined based on the distance between the optical axis of the first lens and the optical axis of the second lens and/or the position of the at least one of the first and second reference points 601 and 602.

A profile of the laser beam 2 may be measured in the detection plane DP. In step 1025 of the method, the alignment of the laser beam 2 relative to the detection system 16 is determined, based on the positions of the first and second images 181 and 182 relative to respective first and second reference points 601 and 602. The positions of the first and second images 181 and 182 relative to respective first and second reference points 601 and 602 may allow determination of misalignment of the laser beam 2, e.g. of the angular and/or linear components of the beam pointing of the laser beam 2, e.g. using a computer program (step 1025). For example, the computer program may be configured to cause the controller 16a to determine misalignment of the laser beam 2 e.g. of the angular and/or linear components of the beam pointing of the laser beam 2, based on the positions of the first and second images 181 and 182 relative to respective first and second reference points 601 and 602. This step can include determining one of a first and second alignment parameters based on the position of one of the first and second images 181 and 182 relative to one of the first and second reference points 601 and 602 (not shown). The position of the first image 181 of the laser beam 2 relative to the first reference point 601 in the detection plane DP may be indicative of the first beam alignment parameter. The position of the second image 182 of the laser beam 2 relative to the second reference point 602 in the detection plane DP may be indicative of the second beam alignment parameter. The first beam alignment parameter can correspond to the linear component of the beam pointing (or beam pointing stability or accuracy) of the laser beam 2. The second beam alignment parameter can correspond to the angular component of the beam pointing (or beam pointing stability or accuracy) of the laser beam 2. Based on the configuration of the diffractive optical system 17, i.e. relative arrangement of the first and second lenses, the number of the lenses and/or the positions of the first and second images 181 and 182 relative to respective first and second reference points 601 and 602, the computer program may be configured to cause the controller 16a to derive the first and/or second beam alignment parameters. The computer program may be configured to cause the controller 16a to provide a user with information on the linear and angular components of the beam pointing, which may be necessary for alignment of the laser beam 2 relative to the detection system 16.

The controller 16a, which may be connected to the detection system 16, may be configured to display the positions of the first and second images 181 and 182 relative to the respective first and second reference points 601, 602. This may provide a visual feedback for a user (step 1030). When misalignment is detected, the method includes aligning the laser beam 2 relative to the detection system 16 such that the positions of the first and second images 181, 182 correspond to positions of the first and second reference points 601, 602 in the detection plane DP (step 1035). This step may include adjusting one or more optical devices of the beam delivery system 1a and/or a position of the laser 1 relative to the detection system 16. The determined of the angular and/or linear components of beam pointing of the laser beam 2 may facilitate alignment of the laser beam 2 relative to the detection system 16.

It will be appreciated that in some embodiments the controller 16a may be, be part of or comprised in a processing system or control unit. A computer program that when executed by the controller 16a causes the controller 16a to determine alignment of the laser beam 2 relative to the detection system 16. For example, the computer program may be configured to cause the controller 16a to determine the alignment the laser beam 2 relative to the detection system 16 based on the positions of the first and second images 181, 182 in the detection plane DP.

The computer program may be configured to cause the controller 16a to provide and/or display information relating to the alignment of the laser beam 2 relative to the detection system 16. The information may be indicative of the alignment of the laser beam 2 relative to the detection system 16. The information may comprise at least one of positions of the at least two images in the detection plane DP, for example relative to at least one of the first and second reference points, and/or at least one of the first and second alignment parameters. The computer program may be configured to cause the controller 16a to display the information to provide a user with visual feedback, e.g. on a display, which is indicated by reference numeral 16b in FIG. 8, of the controller 16a. This may allow a user to align the laser beam 2 relative to the detection system 16, e.g. by adjusting one or more optical devices of the beam delivery system 1a or a position or orientation of the laser 1, while the controller 16a, provides visual feedback via the display 16b. For clarity: the indications "dx" and "dy" in the Figure indicate incremental shifts parallel to the x-axis and in the y-direction, respectively; the indications "drx" and "dry" in the Figure indicate incremental rotations around the x-axis and around the y-axis, respectively.

The computer program may be configured to cause the controller 16a to identify an optical device of the beam delivery system 1a that requires adjustment and/or a degree or level of adjustment of the optical device that is required to align of the laser beam 2 relative to the detection system 16. The computer program may be configured to cause the controller 16a to provide a user with information that is indicative of the optical device that requires adjustment and/or the degree or level of adjustment of the optical device that is required to align the laser beam 2 relative to the detection system 16. The computer program may be configured to cause the controller 16*a* to identify the optical device that requires adjustment based on one or more properties of the beam delivery system 1*a*, e.g. the relative arrangement or orientation, e.g. optical layout, of the one or more optical devices of the beam delivery system 1*a* and/or a position of the/each of the one or more optical devices in the beam delivery system 1*a*. By configuring the computer program to cause the controller 16*a* to identify an optical device of the beam delivery system 1*a* that requires adjustment, the process of aligning the laser beam 2 relative to the detection system 16 may be facilitated and/or expedited. The controller 16*a* may provide information that can be used as feedback to a service engineer or other operative to adjust alignment. In some embodiments, the controller 16*a* may direct the operative as to which manipulators to move and by how much.

The computer program may be configured to cause the controller 16*a* to actuate the optical device of the beam delivery system 1*a* that requires adjustment so as to align the laser beam 2 relative to the detection system 16. An actuator, which may be provided in the form of a manipulator, a motor or the like, may be coupled or connected to the optical device of the beam delivery system 1*a* that requires adjustment. Alternatively or additionally, an actuator may be coupled or connected to each optical device of the beam delivery system 1*a*. The/each actuator may be in communication with, coupled or connected to the controller 16*a*. The/each actuator may be configured to move or adjust the/each optical device of the beam delivery system 1*a*, for example in response to a signal transmitted from the controller 16*a* to the/each actuator, by the degree or level of adjustment that is required to align the laser beam 2 relative to the detection system 16*a*. This may allow for a compact alignment system 15, in which the computer program may cause the controller 16*a* to detect the alignment of the laser beam 2 relative to the detection system 16 and actuate the/each optical device to align the laser beam relative to the detection system, for example when misalignment is detected. Additionally or alternatively, the provision of the/each actuator may allow the alignment system 15 to be automated. In some embodiments beam stabilization may be provided in which the alignment system detects beam drifts and actively compensates the drifts to keep alignment stable.

It will be appreciated that in some embodiments, the computer program may be provided on a carrier medium. The carrier medium may be a tangible, non-transient carrier medium, such as a flash drive, memory stick, optical disk or carrier, magnetic disk or carrier, memory, ROM, RAM, and/or the like. The carrier medium may be, comprise or be comprised in a non-tangible carrier medium such as an electromagnetic wave, electronic or magnetic signal, digital data and/or the like.

Although the alignment system has been described as being used in the beam delivery system of the lithographic system, it should be understood that the alignment system is not restricted to this use, but may additionally or alternatively be arranged in the illumination system of the lithographic apparatus, between the radiation source and the lithographic apparatus or in another part of the lithographic apparatus or lithographic system. It should be further understood that the alignment system described herein is not restricted to the use in a lithography system, but may find application in other optical systems, which may require the alignment of a beam of light, e.g. relative to a detector or optical one or more optical components, such as mirrors, lenses or other optics.

It should be understood that the first image is not restricted to being an image of a zero-th diffraction order and that the second image(s) is/are not restricted to being image (s) of the first diffraction order(s). For example, in other embodiments the two focal lengths of the diffractive optical system may be selected such that changes in the alignment of the laser beam, e.g. the linear and angular components of the beam pointing stability or accuracy, may be visible/detectable in the detection plane and/or be determined. The computer program may cause the controller to detect and/or determine the changes in the alignment of the laser beam. As discussed above, a change in the direction of the laser beam or a shift of the laser beam perpendicular to the axis of propagation of the laser beam may cause a change of the position of the first and/or second images of the laser beam in the detection plane. The computer program may be configured to cause the controller to determine the alignment of the laser beam, e.g. the linear and angular components of the beam pointing stability or accuracy, based on the positions of the first and second images in the detection plane and/or the arrangement of the optical device, e.g. the relative arrangement of the first and second elements in the optical device.

While FIG. 4 shows the reference element 18 as being placed in the reference plane RP, it will be appreciated that in other embodiments the reference element may be placed at another position in the path of the radiation beam 2. For example, the reference element 18 may be placed in the detection plane DP and a relay lens may be used to project the image of the reference element on a detector (which in this embodiment may be placed outside/distal from the detection plane). In some embodiments no physical reference element may be provided and any selected transverse plane may be selected as a reference plane without any physical reference element being provided at the reference plane.

While specific embodiments of the invention have been described above, it will be appreciated that the invention may be practiced otherwise than as described. For example, the alignment of a beam of electromagnetic radiation has been discussed above within the context of lithographic systems. It should also be understood that the alignment system of the invention could also be applied in other fields of use, such as metal cutting or optical measurements.

The descriptions above are intended to be illustrative, not limiting. Thus it will be apparent to one skilled in the art that modifications may be made to the invention as described without departing from the scope of the claims set out below.

The invention claimed is:

1. An alignment system, comprising:
   a beam delivery system configured to pass a beam of electromagnetic radiation;
   a diffractive optical system configured to:
      receive the beam passed by the beam delivery system;
      project onto a detection plane an image representative of the beam intersecting a reference plane;
   a detection system configured to detect the projected image at the detection plane; and
   a controller configured to:
      control the diffractive optical system;
      determine a position of the beam relative to a reference position in the reference plane; and
      determine a direction of the beam relative to a reference direction in the reference plane; and wherein the diffractive optical system comprises a first lens and second lens and a diffraction grating to diffract the electromagnetic radiation into different diffraction orders, such that the first lens is operative to create a first projection of a first specific one of the different diffraction orders onto a first location in the detection plane and the second lens is operative to create a second projection of a second specific one of the different diffraction orders onto a second location in the detection plane different from the first location.

2. The alignment system of claim 1, wherein the first projection and the second projection are substantially non-overlapping.

3. The alignment system of claim 1, wherein:
the first specific one of the different diffraction orders is a zero-th diffraction order;
the first lens is operative to project onto the detection plane a first image of an intensity distribution of the beam in a cross-section with the reference plane;
the second specific one of the different diffraction orders is a first diffraction order; and
the second lens has a focal length substantially equal to a distance between the second lens and the detection plane.

4. The alignment system of claim 1 wherein:
the diffractive optical system has a third lens; and
the third lens is operative to create a third projection of a third specific one of the different diffraction orders onto a third location in the detection plane different from the first location and different from the second location.

5. The alignment system of claim 4, wherein:
the second specific one of the different diffraction orders is a first diffraction order; and
the third specific one of the different diffraction orders is another first diffraction order.

6. The alignment system of claim 1, wherein:
the diffractive optical system has a third lens, a fourth lens and a fifth lens;
the third lens is operative to create a third projection of a third specific one of the different diffraction orders onto a third location in the detection plane different from the first location and different from the second location;
the fourth lens is operative to create a fourth projection of a fourth specific one of the different diffraction orders onto a fourth location in the detection plane different from the first location, different from the second location and different from the third location; and
the fifth lens is operative to create a fifth projection of a fifth specific one of the different diffraction orders onto a fifth location in the detection plane different from the first location, different from the second location, different from the third location and different from the fourth location.

7. The alignment system of claim 6, wherein:
the diffractive optical system implements a two-dimensional grating;
the two-dimensional grating is operative to produce four different first diffraction orders (0,1), (1,0), (−1,0) and (0,−1);
the first specific one of the different diffraction orders is a zero-th diffraction order;
the second specific one of the different diffraction orders is a first one of the four different first diffraction orders;
the third specific one of the different diffraction orders is a second one of the four different first diffraction orders;
the fourth specific one of the different diffraction orders is a third one of the four different first diffraction orders;
the fifth specific one of the different diffraction orders is a fourth one of the four different first diffraction orders;
the first lens is operative to project onto the detection plane a first image of an intensity distribution of the beam in a cross-section with the reference plane; and
each respective one of the second lens, the third lens, the fourth lens and the fifth lens has a respective focal length substantially equal to a distance between the respective lens and the detection plane.

8. The alignment system of claim 1, wherein the diffractive optical system includes a hologram.

9. The alignment system of claim 1, wherein the alignment system comprises:
an actuator configured to adjust at least one of a further position and an orientation of the optical device; and
wherein the controller is further configured to receive an output signal from the detection system and control the actuator in dependence on the output signal received.

10. A lithographic apparatus-comprising the alignment system of claim 1.

* * * * *